(12) United States Patent
Shin et al.

(10) Patent No.: US 9,547,544 B2
(45) Date of Patent: Jan. 17, 2017

(54) METHOD FOR VERIFYING BAD PATTERN IN TIME SERIES SENSING DATA AND APPARATUS THEREOF

(71) Applicant: SAMSUNG SDS CO., LTD., Seoul (KR)

(72) Inventors: Kae Young Shin, Yongin-si (KR); Dae Jung Ahn, Yongin-si (KR); Dae Hong Seo, Seoul (KR); Woo Young Jung, Yongin-si (KR)

(73) Assignee: SAMSUNG SDS CO., LTD., Seoul (KR)

( * ) Notice: Subject to any disclaimer, the term of this patent is extended or adjusted under 35 U.S.C. 154(b) by 206 days.

(21) Appl. No.: 14/306,967

(22) Filed: Jun. 17, 2014

(65) Prior Publication Data

US 2014/0372813 A1    Dec. 18, 2014

(30) Foreign Application Priority Data

Jun. 18, 2013 (KR) .................. 10-2013-0069678

(51) Int. Cl.
| | |
|---|---|
| G06F 11/00 | (2006.01) |
| G06F 11/07 | (2006.01) |
| H03M 13/01 | (2006.01) |
| G01R 31/317 | (2006.01) |

(52) U.S. Cl.
CPC ......... *G06F 11/076* (2013.01); *G06F 11/0703* (2013.01); *G06F 11/0706* (2013.01); *G01R 31/3171* (2013.01); *H03M 13/015* (2013.01)

(58) Field of Classification Search
CPC .............. G06F 11/1076; G06F 11/0703; G01R 31/3171; H03M 13/015
USPC ......................... 714/704, 799, 705
See application file for complete search history.

(56) References Cited

U.S. PATENT DOCUMENTS

| | | | | |
|---|---|---|---|---|
| 5,661,763 A | * | 8/1997 | Sands ........................ | G06F 7/02 375/342 |
| 5,835,507 A | * | 11/1998 | Huang ........................ | H04L 1/20 714/704 |
| 6,188,672 B1 | * | 2/2001 | Herzog ................... | H04L 1/242 370/242 |

(Continued)

OTHER PUBLICATIONS

Notification dated Nov. 19, 2014, issued by the International Searching Authority in counterpart International Application No. PCT/KR2014/005313.

(Continued)

*Primary Examiner* — Albert Decady
*Assistant Examiner* — Osman M Alshack
(74) *Attorney, Agent, or Firm* — Sughrue Mion, PLLC

(57) ABSTRACT

A method for verifying bad pattern in time series sensing data by calculating a bad pattern error rate, which can be applied to the time series sensing data measured and produced from a predetermined sensor provided in predetermined equipment, and an apparatus thereof are provided. The method includes receiving information on the bad pattern applied to time series sensing data measured by a suspicious sensor, accessing the time series sensing data of each product, generated by the suspicious sensor during a verification period, calculating similarity measures between the bad pattern based on the bad pattern information and the time series sensing data for each product, and calculating an error rate of the bad pattern based on the similarity measures.

12 Claims, 21 Drawing Sheets

(56) References Cited

U.S. PATENT DOCUMENTS

| | | | |
|---|---|---|---|
| 8,706,459 B2* | 4/2014 | Gupta | G08G 1/0108 |
| | | | 703/6 |
| 9,218,570 B2* | 12/2015 | Biem | G06N 5/046 |
| 2003/0033125 A1 | 2/2003 | Picone et al. | |
| 2004/0088722 A1* | 5/2004 | Peker | G06F 17/30787 |
| | | | 725/19 |
| 2005/0209820 A1 | 9/2005 | Inoue et al. | |
| 2007/0118270 A1* | 5/2007 | Wiseman | F01D 17/24 |
| | | | 701/100 |
| 2008/0228306 A1 | 9/2008 | Yetter et al. | |
| 2010/0268501 A1 | 10/2010 | Chu et al. | |
| 2012/0166142 A1* | 6/2012 | Maeda | G05B 23/0227 |
| | | | 702/185 |
| 2013/0073260 A1* | 3/2013 | Maeda | G05B 23/0224 |
| | | | 702/183 |
| 2015/0304346 A1* | 10/2015 | Kim | H04L 63/1408 |
| | | | 726/23 |

OTHER PUBLICATIONS

Search Report dated Nov. 19, 2014, issued by the International Searching Authority in counterpart International Application No. PCT/KR2014/005313.

Written Opinion dated Nov. 19, 2014, issued by the International Searching Authority in counterpart International Application No. PCT/KR2014/005313.

\* cited by examiner

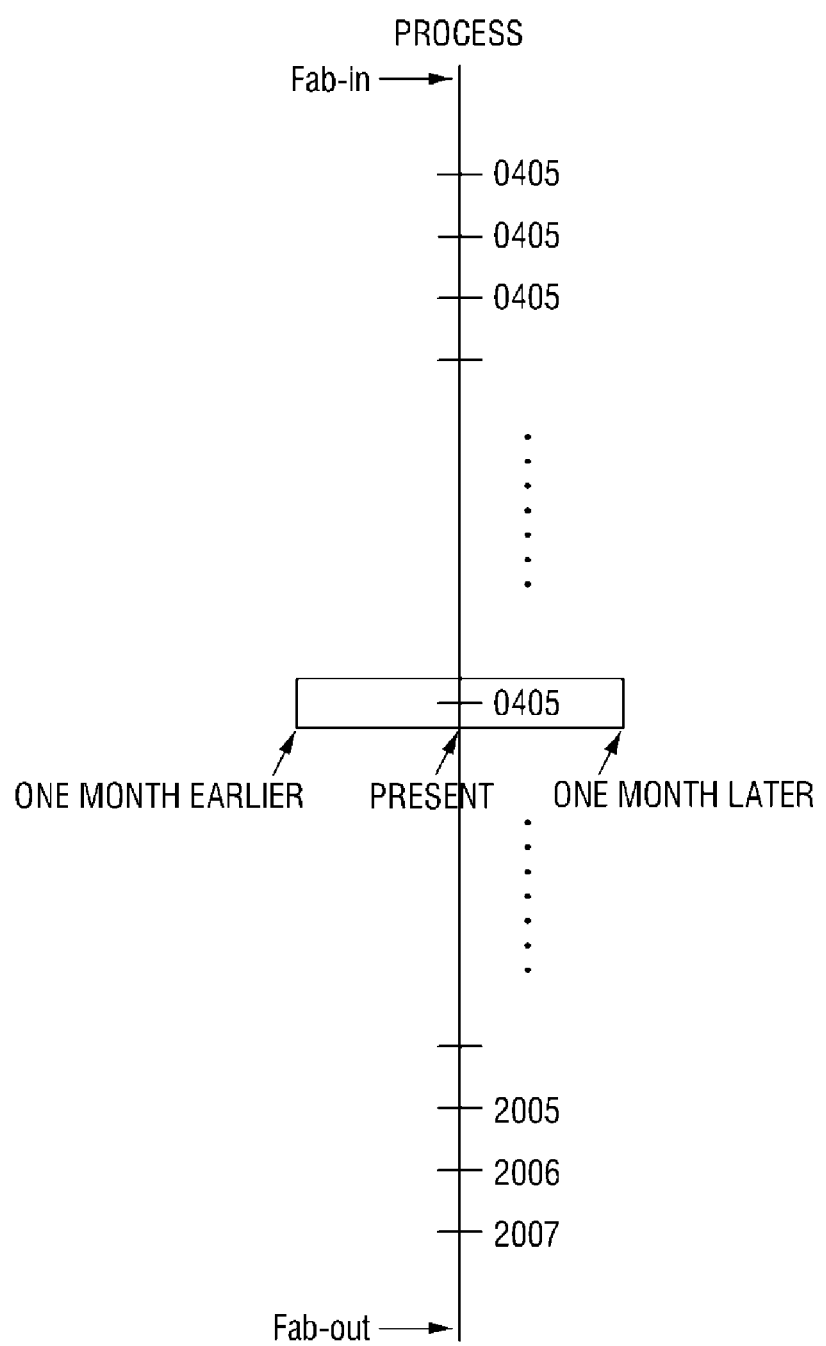

FIG. 6
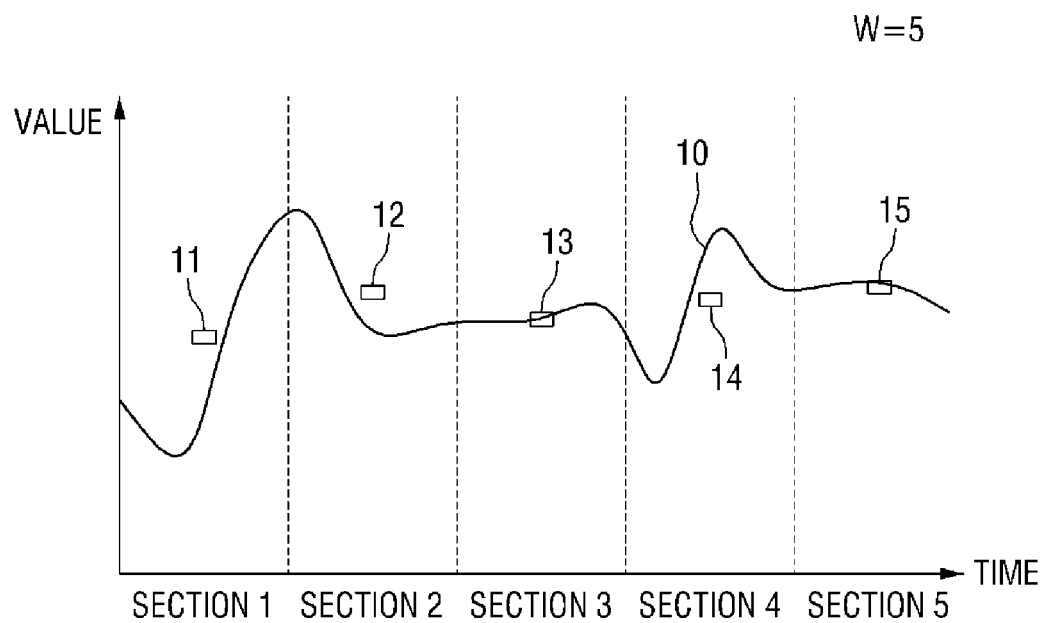
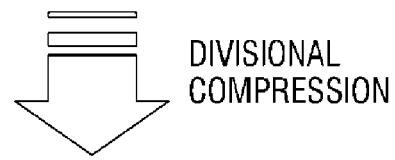
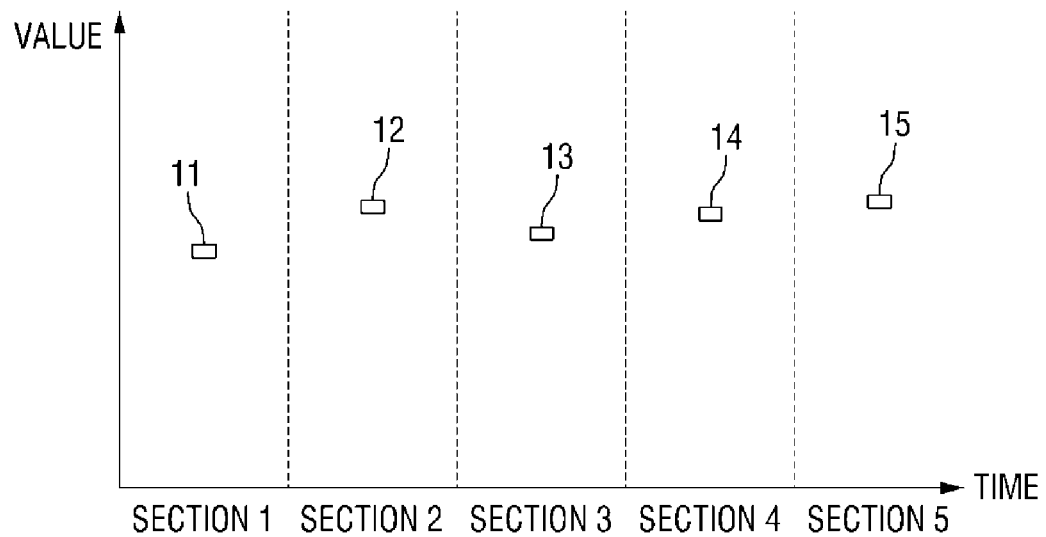

FIG. 7
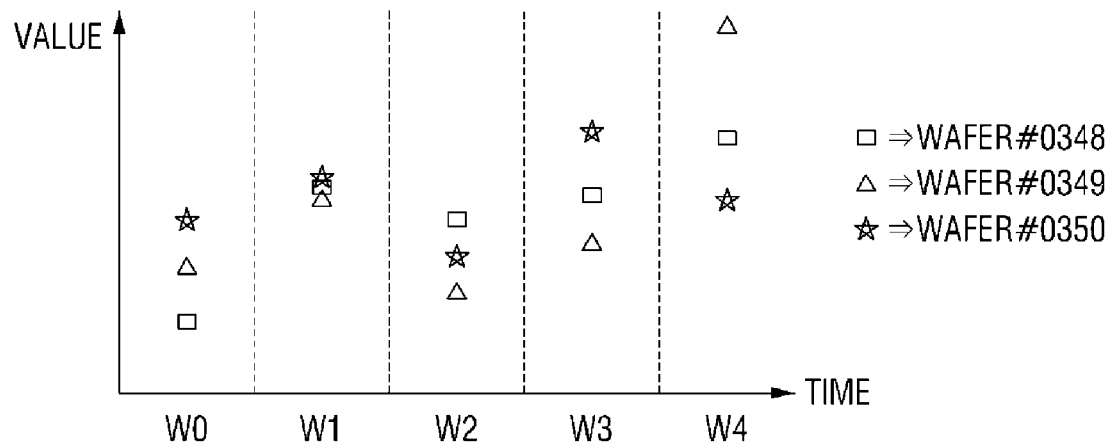
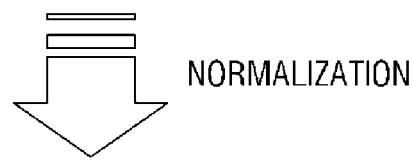
NORMALIZATION
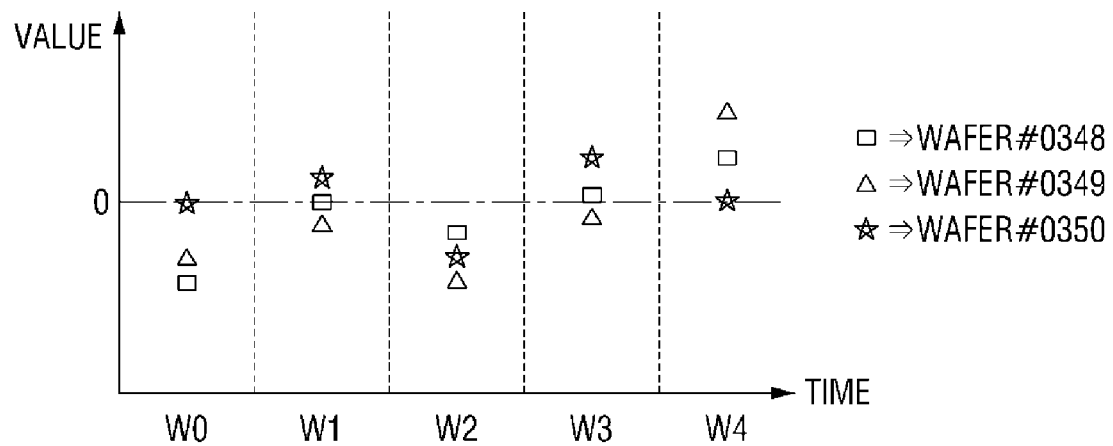

FIG. 8A
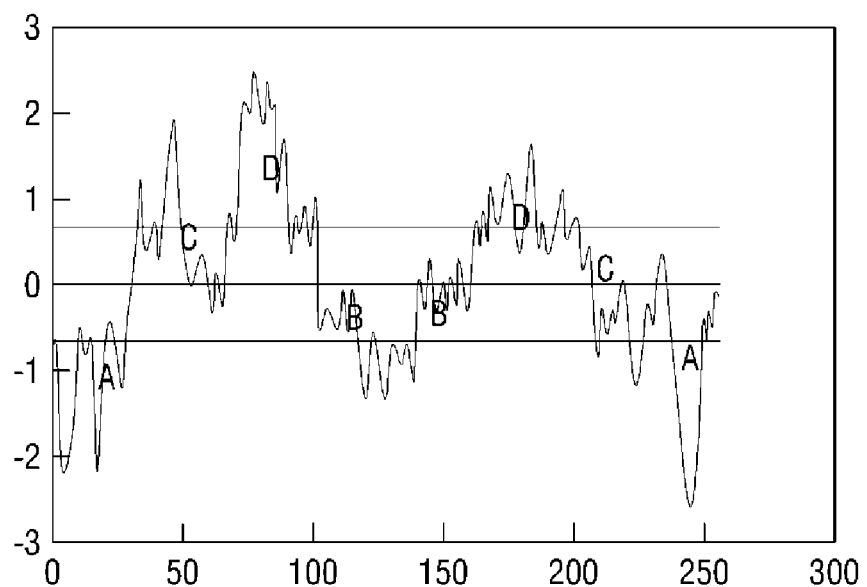
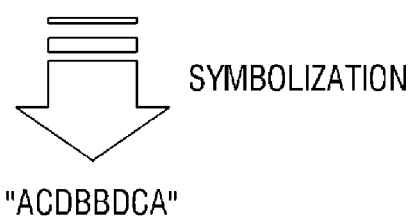
SYMBOLIZATION
"ACDBBDCA"

FIG. 9

Bad Pattern : 65 67 68 65 65

| Rank | Glass ID | SAXed Sensor Data | Similarity Measures ||| Good/Bad |
|---|---|---|---|---|---|---|
| | | | Euclidean Ratio | Correlation | Trend Similarity | |
| 1 | $y_2$ | 65 67 68 65 65 | 1.000 | 1.000 | 1.000 | B |
| 2 | $y_3$ | 65 67 69 64 65 | 0.9236 | 0.9723 | 0.7500 | B |
| 3 | $y_1$ | 66 68 69 66 66 | 0.8793 | 1.000 | 1.000 | B |
| 4 | $y_4$ | 65 69 69 69 65 | 0.7526 | 0.6455 | 0.2500 | G |
| 5 | $y_5$ | 70 71 78 76 74 | 0 | 0.3698 | 0.7500 | G |

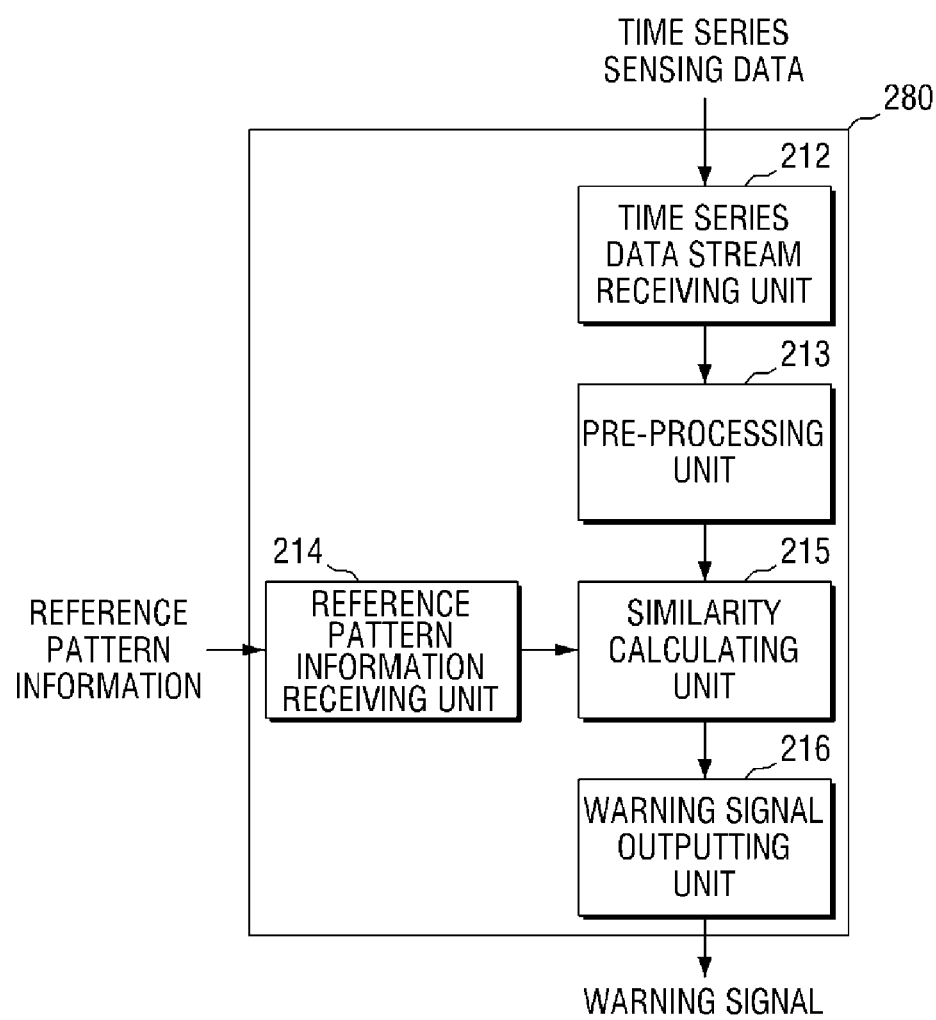

METHOD FOR VERIFYING BAD PATTERN IN TIME SERIES SENSING DATA AND APPARATUS THEREOF

CROSS-REFERENCE TO RELATED APPLICATION

This application claims priority from Korean Patent Application No. 10-2013-0069678 filed on Jun. 18, 2013 in the Korean Intellectual Property Office, and all the benefits accruing therefrom under 35 U.S.C. 119, the contents of which in its entirety are herein incorporated by reference.

BACKGROUND

1. Field of the Invention

The present invention relates to a method for verifying bad pattern in time series sensing data and an apparatus thereof. More particularly, the present invention relates to a method for verifying bad pattern in time series sensing data by calculating a bad pattern error rate, which can be applied to time series sensing data measured and produced from a predetermined sensor provided in predetermined equipment, and an apparatus thereof.

2. Description of the Related Art

In producing a product, it is very important to maintain a product quality while achieve a production yield. Therefore, in order to increase the production yield, it is necessary to find and diagnose an abnormal condition of the progress of a process or equipment at an early stage. To this end, fault detection & classification (FDC) technology has been introduced to monitor the condition of the process, to detect probable faults and to classify types of the faults.

SUMMARY

The present invention provides an apparatus and method for verifying bad pattern in time series sensing data.

The present invention also provides an apparatus and method for verifying reliability of bad pattern by calculating an error rate of the bad pattern by comparing a predetermined bad pattern with time series sensing data at the time of producing each product.

The present invention also provides an apparatus and method for verifying bad pattern, to which a method for calculating similarity measures between time series sensing data generated in the course of producing a product and the bad pattern specialized to the time series sensing data.

The present invention also provides an apparatus and method for verifying bad pattern by calculating a bad pattern error rate based on the failure ratio of products having time series sensing data determined to be similar to the bad pattern.

The present invention also provides a method and equipment for determining a fault by calculating a similarity measure between a predetermined bad pattern and time series sensing data measured by a sensor provided within the equipment.

The present invention also provides production equipment having one or more sensors, which determines a similarity measure between the time series sensing data and a predetermined bad pattern on a real time basis and generates a warning signal according to the determination result.

The present invention also provides production equipment having one or more sensors, which determines similarity between the time series sensing data and a predetermined bad pattern on a real time basis and generates a warning signal according to the determination result, and a method for monitoring sensor-measured data of the production equipment.

The present invention also provides a bad pattern detecting apparatus, which receives time series sensing data from production equipment having one or more sensors, determines similarity between the time series sensing data and a predetermined bad pattern on a real time basis and generates a warning signal according to the determination result, and a method therefore.

These and other objects of the present invention will be described in or be apparent from the following description of the exemplary embodiments.

According to an aspect of the present invention, there is provided a method for verifying bad pattern in time series sensing data, the method comprising receiving bad pattern information applied to sensing data measured by a sensor, accessing the sensing data of each product, generated by the sensor, calculating similarity measures between the bad pattern based on the bad pattern information and the accessed sensing data, and calculating an error rate of the bad pattern based on the similarity measures.

According to another aspect of the present invention, there is provided an apparatus for verifying a bad pattern in sensing data, the apparatus comprising a verification parameter receiving unit configured to receive verification parameters including information on the bad pattern applied to sensing data of a sensor and information on a verification method, a sensing data extracting unit configured to access the sensing data of each product, generated by the sensor based on verification method information, a similarity measure calculating unit configured to calculate similarity measures between the bad pattern based on the bad pattern information and the sensing data, for each product, and a bad pattern verification unit configured to calculate an error rate of the bad pattern based on the similarity measures.

According to still another aspect of the present invention, there is provided a method for monitoring sensing data of equipment, the method comprising receiving information on a bad pattern applied to sensing data measured from a sensor, receiving sensing data information from the sensor, calculating similarity measures of an Euclidean ratio, a correlation and a trend similarity between the bad pattern based on bad pattern information and the sensing data, each of the Euclidean ratio, the correlation and the trend similarity having a value in a range between 0, which means non-similarity, and 1, which means sameness, and generating a warning signal when a calculated value of at least one from among the Euclidean ratio, the correlation and the trend similarity is 1, wherein the trend similarity is a measured value pattern one of increasing and decreasing according to a passage of time.

According to a further aspect of the present invention, there is provided production equipment comprising one or more sensors generating sensing data, a sensing data stream receiving unit configured to receive a sensing data stream measured from the one or more sensors, a bad pattern information receiving unit configured to receive information on a bad pattern applied to sensing data measured by each of the one or more sensors, a similarity measure calculator configured to calculate similarity measures of an Euclidean ratio, a correlation and a trend similarity between the bad pattern based on the bad pattern information and the sensing data, each of the Euclidean ratio, the correlation and the trend similarity having a value in a range between 0, which means non-similarity, and 1, which means sameness, and a warning signal output unit configured to generate a warning signal when a calculated value of at least one from among the Euclidean ratio, the correlation and the trend similarity is 1.

According to a further aspect of the present invention, there is provided a reference pattern detecting apparatus comprising a sensing data stream receiving unit configured to receive a sensing data stream measured from one or more sensors, a reference pattern information receiving unit configured to receive information on a reference pattern applied to the sensing data generated from each of the one or more sensors, and a similarity measure calculator configured to calculate and output similarity measures of an Euclidean ratio, a correlation and a trend similarity between the reference pattern based on reference pattern information and the sensing data, each of the Euclidean ratio, the correlation and the trend similarity having a value in a range between 0, which means non-similarity, and 1, which means sameness.

As described above, according to the present invention, the reliability of a predetermined bad pattern can be verified using an actual production result, thereby obtaining bad pattern with high reliability.

In addition, time series sensing data generated from each of one or more sensors is analyzed to determine whether the time series sensing data is similar to a predetermined bad pattern, and if yes, a warning signal is generated, thereby determining a value of the time series sensing data is within a predetermined range and monitoring whether the sensor-measured data of the production equipment represents the predetermined bad pattern.

Further, according to the present invention, appropriate measured values can be taken in a case where generation of time series sensing data similar to the bad pattern is detected during production equipment monitoring process.

BRIEF DESCRIPTION OF THE DRAWINGS

The above and other features and advantages of the present invention will become more apparent by describing in detail exemplary embodiments thereof with reference to the attached drawings in which:

FIG. 3 is a conceptual diagram illustrating time series sensing data of a product used in verifying bad pattern in the bad pattern verifying method shown in FIG. 1;

FIG. 6 is a conceptual diagram illustrating a divisional compression process in the pre-processing process shown in FIG. 5;

FIG. 7 is a conceptual diagram illustrating a normalization process in the pre-processing method shown in FIG. 5;

FIGS. 8A and 8B are conceptual diagrams illustrating a symbolization process in the pre-processing process shown in FIG. 5;

FIG. 9 illustrates a verification result by the bad pattern verifying method shown in FIG. 1;

FIG. 19 is a second block diagram schematic diagram of a reference pattern detection system according to still another embodiment of the present invention.

DETAILED DESCRIPTION OF THE EMBODIMENTS

Figure 1:
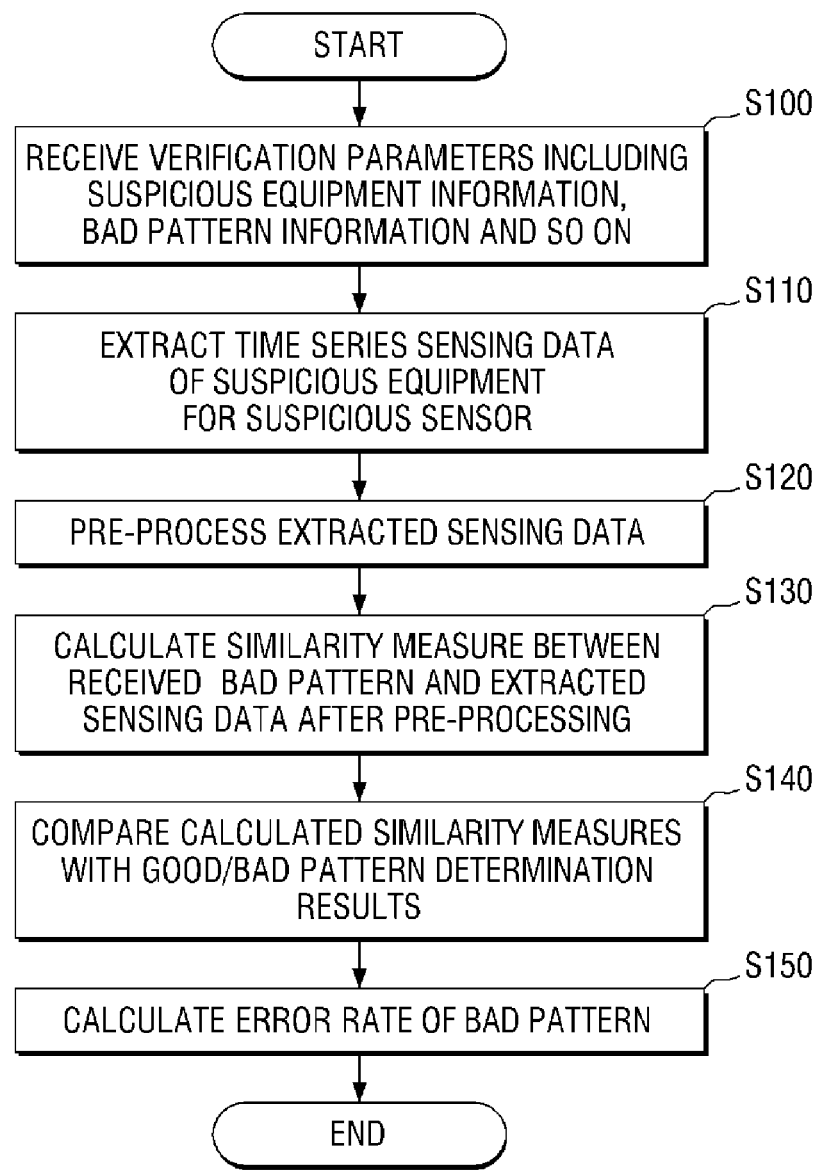
FIG. 1 is a flowchart of a method for verifying bad pattern in time series sensing data according to an embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification of the present invention, the term "production equipment" may be used to refer to particular equipment of a particular process. For example, assuming that certain products are produced through a PHOTO process, a DRY process and a DEPOSITION process, one among various equipments of each process or one of multiple production lines of each process having multiple equipments sequentially arranged may be allocated to each of the products to allow the product to pass through the allocated equipment or production line. The production equipment refers to one among multiple equipments constituting each process.

In addition, throughout the specification of the present invention, the term "time series sensing data" may mean data having measured values generated by a sensor incorporated in the production equipment serially recorded according to the passage of time.

FIG. 1 is a flowchart of a method for verifying bad pattern in time series sensing data according to an embodiment of the present invention.

First, parameters for verification are received from a user terminal (S100). The verification parameters include information required for verification. For example, the verification parameters may include at least one of information on data of bad pattern and suspicious equipment and a suspicious sensor to which the bad pattern are applied, information on a verification period for extracting time series sensing data used in verifying the bad pattern, and information used in pre-processing the time series sensing data used in verifying the bad pattern. Here, the "suspicious" equipment and the "suspicious" sensor may be so designated because they are suspected to cause a fault.

The bad pattern data may be the time series sensing data of the bad pattern, address information for accessing the time series sensing data of the bad pattern, or pre-processed data of the time series sensing data of the bad pattern.

The term "bad pattern" used in the specification of the present invention will now be briefly described with reference to FIGS. 2A to 2I. A temporary or usual fault generated in the production equipment or a fault generated under a particular condition may be reflected on values measured by a sensor provided in the production equipment, and time series sensing data of the measured values may have a predetermined pattern indicating the fault.

Figure 2A:
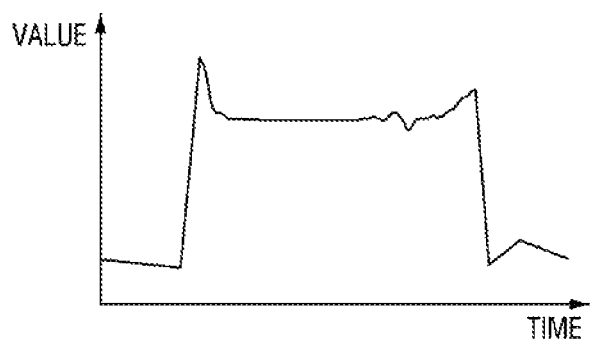
FIGS. 2A to 2I illustrate examples of bad pattern in time series sensing data.
Figure 2B:
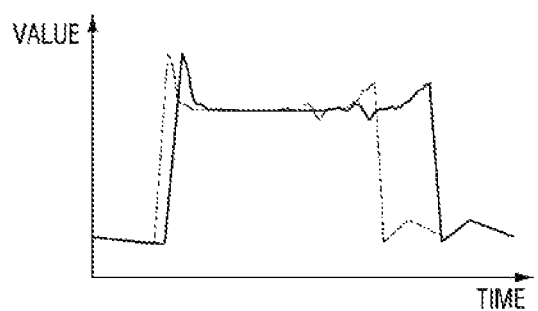
Figure 2C:
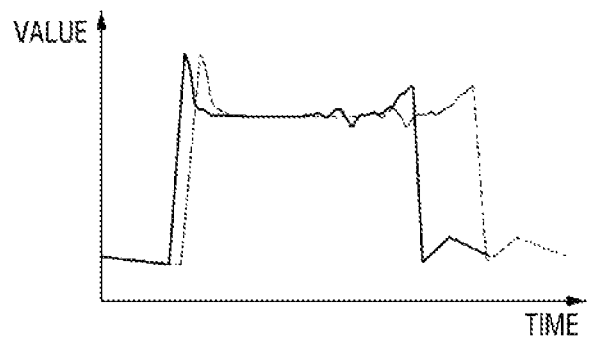
Figure 2D:
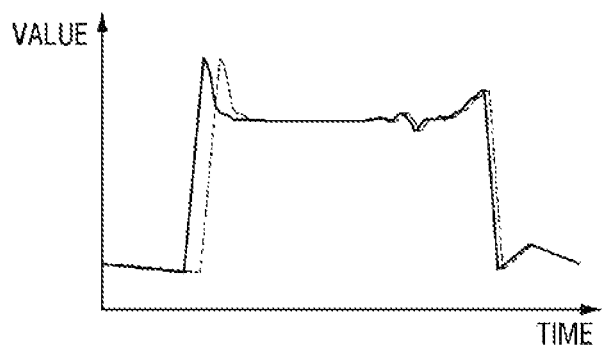
Figure 2E:
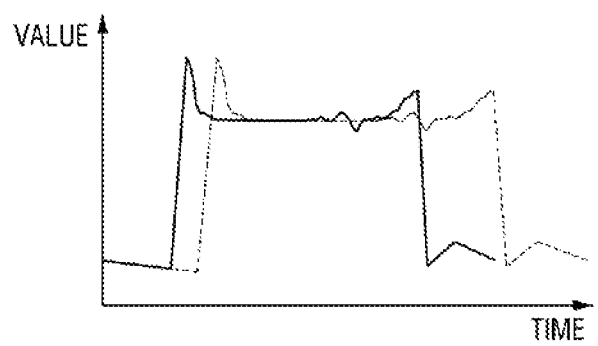
Figure 2F:
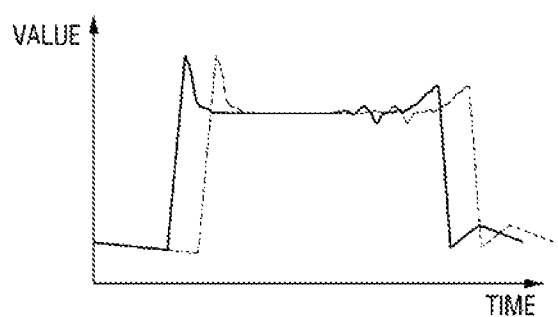
Figure 2G:
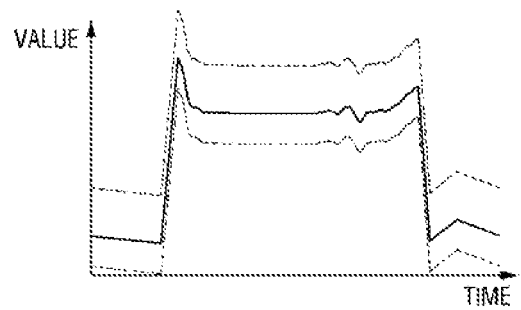

FIG. 2A illustrates a normal time series sensing data pattern of a particular sensor provided in particular equipment and FIGS. 2B to 2I illustrate "bad pattern" in cases where different kinds of faults are generated. FIG. 2B illustrates fault of a process due to rapid progress. FIG. 2C illustrates fault of a process due to slow progress. FIG. 2D illustrates late start and early shift of a process. FIG. 2E illustrates late start and late progress/shift of a process. FIG. 2F illustrates the overall progress is delayed. FIG. 2G illustrates that sensor-measured values are drifted upward/downward as a whole while a process time is normal.

Figure 2H:
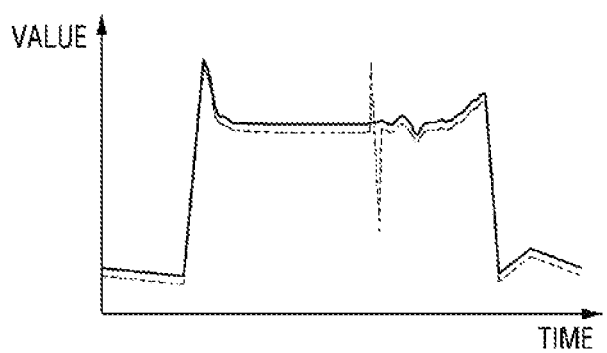
Figure 2I:
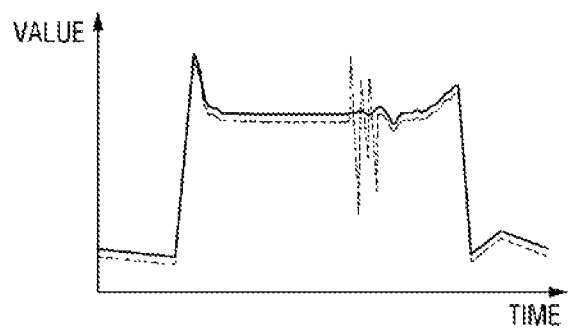

FIG. 2H illustrates that sensor-measured values are deviated from a normal range in a particular point in a process for a short period of time. FIG. 2I illustrates that sensor-measured values are deviated from a normal range in a particular point in a process for a long period of time.

In the specification of the present invention, the term "bad pattern" is used to mean patterns in time series sensing data measured by a sensor provided within the production equipment to indicate temporary or usual faults generated in the production equipment or faults generated under a particular condition. For example, the "bad pattern" may include combinations of one or two or more of the bad pattern shown in FIGS. 2B to 2I.

Referring back to FIG. 1, after the verification parameters are received, time series sensing data of suspicious equipment for a suspicious sensor is extracted (S110). When only particular suspicious equipment is designated in the verification parameters without designating a particular suspicious sensor, time series sensing data for all sensors provided in the particular suspicious equipment are extracted.

The time series sensing data to be extracted will now be described briefly with reference to FIG. 3. The time series sensing data may be extracted from, for example, fault detection & classification (FDC) data.

FIG. 3 is a conceptual diagram illustrating time series sensing data of a product used in verifying bad pattern in the bad pattern verifying method shown in FIG. 1.

As shown in FIG. 3, a product may be produced through multiple processes from a Fab-in process to a Fab-out process. Specifically, when equipment in charge of a particular process is designated as suspicious equipment, the time series sensing data generated by the suspicious equipment are collected for a predetermined period to be used in verifying bad pattern. FIG. 3 illustrates time series sensing data generated by a sensor provided in suspicious equipment in a process '0405' are collected for a period from one month earlier to one month later than the present time. The collected time series sensing data may include time series sensing data pieces measured whenever processes, in which each product passes through the suspicious equipment, are carried out. A point in time for extracting the time series sensing data may be based on information on a verification period for extracting the time series sensing data used in verifying the bad pattern included in the verification parameters.

Referring back to FIG. 1, after the extracting of the time series sensing data is completed (S110), in order to calculate similarity measures between the extracted time series sensing data and the bad pattern, the extracted time series sensing data may be pre-processed (S120). The bad pattern and the extracted time series sensing data should be pre-processed in the same manner. Therefore, in a case where pre-processed bad pattern are not indicated by the bad pattern information included in the verification parameters, the bad pattern are pre-processed in the same manner with the extracted time series sensing data. The pre-processing according to the present invention will later be described in more detail with reference to FIG. 5.

Next, after the pre-processing (S120), similarity measures between the bad pattern and the pre-processed extracted time series sensing data are calculated (S130). For example, when FDC data of the particular suspicious equipment are collected for the last one month and 1000 products have pass through the suspicious equipment for the last one month, there exists time series sensing data for each of the 1000 products, and similarity measures between the bad pattern and each of 1000 time series sensing data pieces are calculated. The respective 1000 time series sensing data pieces may be arranged on the basis of the similarity measures.

After the calculating of the similarity measures is completed (S130), fault determining information of a product corresponding to each of the time series sensing data pieces is accessed, and the calculated similarity measures are compared with good/bad determination results (S140). That is to say, a number of cases of being determined as a good product, and the time series sensing data of the product being determined to be similar to the bad pattern. According to the result of the comparing (S140), a bad pattern error rate is calculated (S150).

The error rate may be calculated as a value obtained by dividing a number of products determined as good products even if they are determined to be similar to the bad pattern by a number of products having time series sensing data determined to be similar to the bad pattern.

Figure 4:
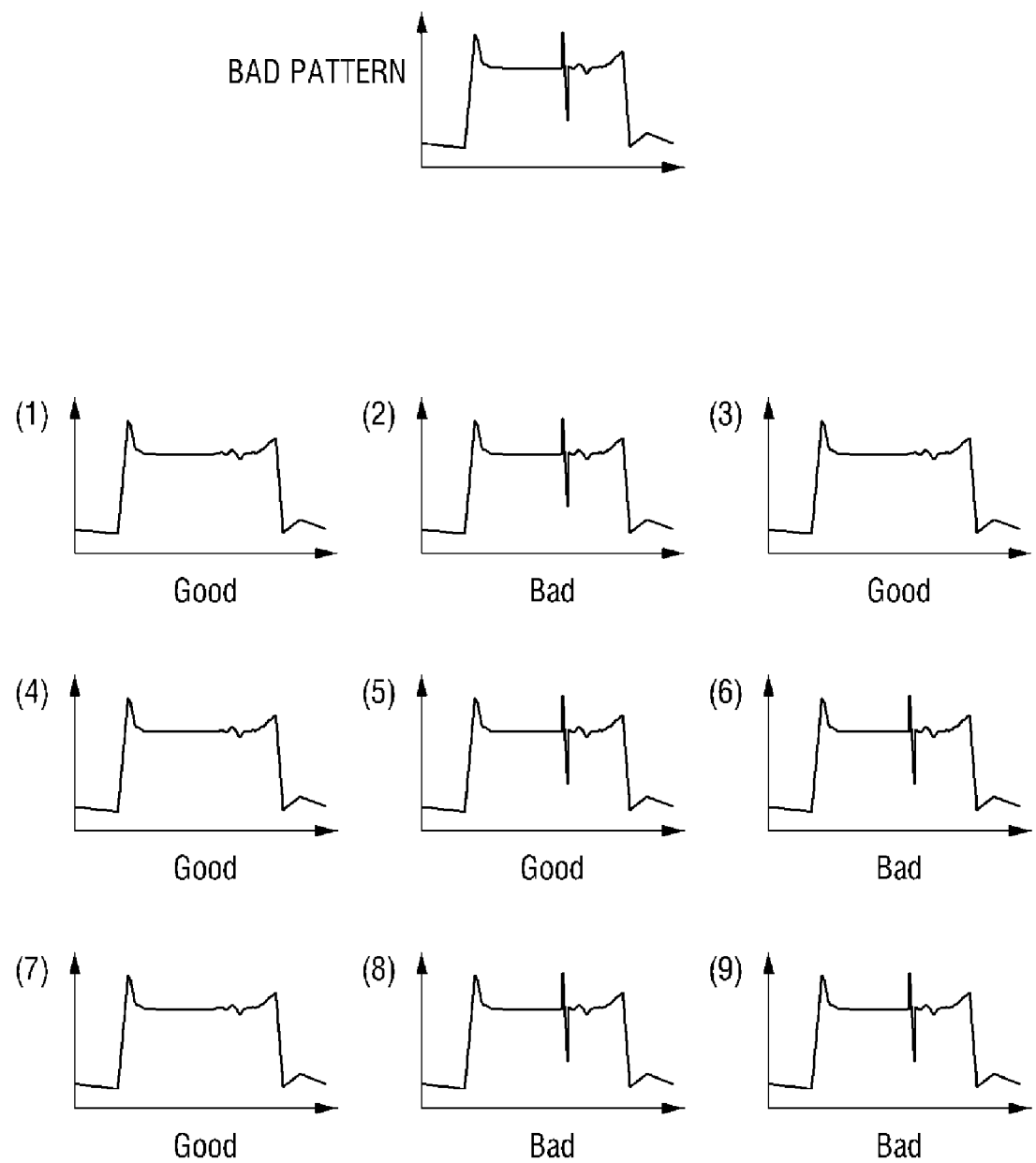
FIG. 4 is a conceptual diagram illustrating a process for calculating a bad pattern error rate in the bad pattern verifying method shown in FIG. 1.

FIG. 4 is a conceptual diagram illustrating a method for calculating a bad pattern error rate in the bad pattern verifying method shown in FIG. 1.

As shown in FIG. 4, time series sensing data pieces for 9 products are extracted, and among that, there exist 5 time series sensing data pieces similar to the bad pattern, as represented by graphical representations (1), (5), (6), (8) and (9). However one time series sensing data piece (5) is determined as a good product. Therefore, the calculated error rate may be 1/5 (=20%).

According to the present embodiment of the present invention, the error rate is calculated as a ratio of the number of the bad pattern suspected as patterns causing faults to the number of products determined to be similar to the bad pattern and determined as good products. This embodiment numerically calculates the reliability of the bad pattern using time series sensing data generated during actual production as verification data.

In order to accurate calculate the error rate, it is important to accurately calculate similarity measures between the bad pattern and the time series sensing data of each product. In addition, in order to accurately calculate similarity measures between the bad pattern and the time series sensing data of each product, an appropriate pre-processing process should be performed. Hereinafter, the pre-processing process according to the present embodiment will be described with reference to FIGS. 5 to 8B.

Figure 5:
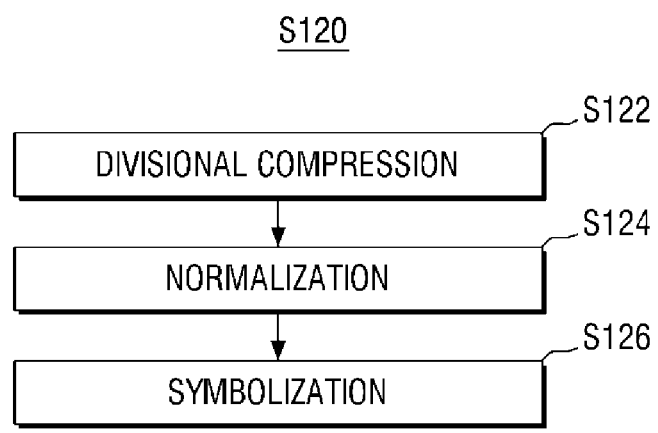
FIG. 5 is a flowchart illustrating a process of pre-processing time series sensing data of a product used in verifying bad pattern in the bad pattern verifying method shown in FIG. 1.

FIG. 5 is a flowchart illustrating a process of pre-processing time series sensing data of a product used in verifying bad pattern in the bad pattern verifying method shown in FIG. 1.

As shown in FIG. 5, the time series sensing data may be pre-processed through processes of divisional compression (S122), normalization (S124) and symbolization (S126).

First, although not shown in FIG. 5, prior to the divisional compression (S122), compensation of missing values may be performed. Since there are missing parts in measured values of the time series sensing data, the missing values can be compensated from other measured values using interpolation.

In the divisional compression of the time series sensing data (S122), the measured value data sensed on a short time basis, for example, in units of seconds, are divided into a predetermined number (W) of sections and only one representative value is stored in each section. For example, when 10 measured value data pieces each section is compressed into one representative value data section, the time series sensing data of the measured values may be compressed to have a tenth of a data size.

The representative value of each section may be a mean value of the measured values in the section.

The predetermined number (W) of sections may be a value included in the verification parameters.

Assuming that the divided sections are denoted by $C_1$, $C_2$, ..., $C_w$ and values of sensor-measured time series sensing data are denoted by $D_1$, ..., $D_n$, the divided sections may be defined in Equation (1):

$$C_i = \left(\left\lceil \frac{n}{w}(i-1)+1 \right\rceil, \left\lceil \frac{n}{w}i \right\rceil\right) \tag{1}$$

Table 1 demonstrates a case where time series sensing data including 10 measured value data are divided into 6 sections, and Table 2 demonstrates a case where time series sensing data including 10 measured value data are divided into 3 sections.

TABLE 1

| i | Starting point | End point | Number |
|---|---|---|---|
| 1 | 1 | 2 | 2 |
| 2 | 3 | 4 | 2 |
| 3 | 5 | 5 | 1 |
| 4 | 6 | 7 | 2 |
| 5 | 8 | 9 | 2 |
| 6 | 10 | 10 | 1 |
| | | | 10 |

TABLE 2

| i | Starting point | End point | Number |
|---|---|---|---|
| 1 | 1 | 4 | 4 |
| 2 | 5 | 7 | 3 |
| 3 | 8 | 10 | 3 |
| | | | 10 |

In addition, the mean value of the divided sections $C_i$ may be calculated, as mathematically expressed in Equation (2):

$$\overline{C}_i = \frac{1}{\left\lceil \frac{n}{w}i \right\rceil - j + 1} \sum_{j=\left\lceil \frac{n}{w}(i-1)+1 \right\rceil}^{\left\lceil \frac{n}{w}i \right\rceil} D_j \tag{2}$$

where ⌈ ⌉ means a ceiling.

FIG. 6 is a conceptual diagram illustrating a divisional compression process (S122) in the pre-processing process shown in FIG. 5.

As shown in FIG. 6, when the predetermined number (W) of sections included in the verification parameters is 5, a time axis of the time series sensing data is divided into 5 sections. In addition, mean values (11, 12, 13, 14, 15) of the time series sensing data 10 for each section is calculated. After the divisional compression (S122), only the mean values 11, 12, 13, 14 and 15, rather than all of the 10 time series sensing data pieces, are stored, thereby achieving a data compressing effect. In addition, as only the mean values are stored for each section, some of noise values are averaged, thereby achieving a noise removing effect.

FIG. 7 is a conceptual diagram illustrating a normalization process (S123) in the pre-processing process shown in FIG. 5.

The time series sensing data resulting after performing the divisional compression process shown in FIG. 6 may be normalized using a mean and a variance of the mean values of the respective sections for effective comparison between Good and Bad groups (S123). The upper graphical representation of FIG. 7 illustrates divisionally compressed time series sensing data prior to normalization and the lower graphical representation of FIG. 7 illustrates time series sensing data after normalization.

Figure 8B:
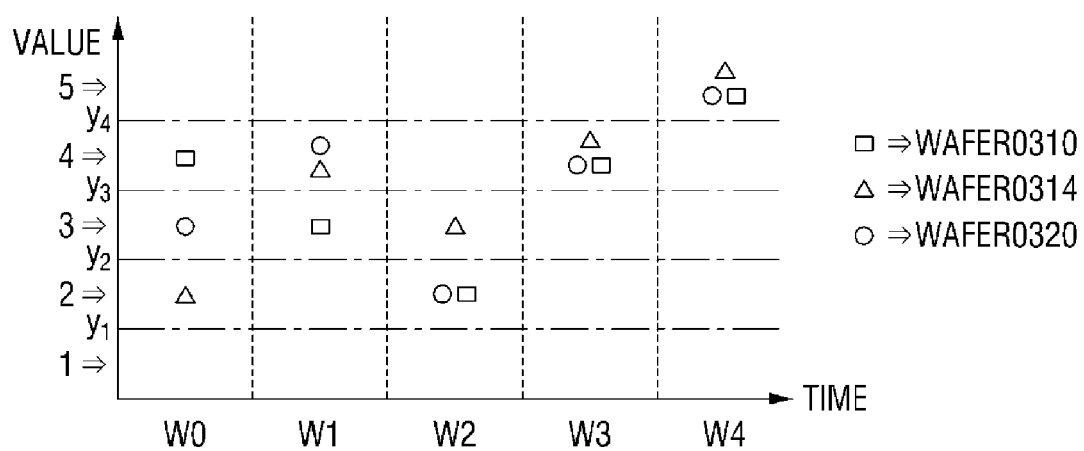

FIGS. 8A and 8B are conceptual diagrams illustrating a symbolization process (S124) in the pre-processing process shown in FIG. 5.

The time series sensing data resulting after the normalization shown in FIG. 7 may be SAX (Symbolic Aggregate approXimation) converted into symbols on the basis of critical values for the time series sensing data. Here, a number of symbols (α) may be included in the verification parameters. When the measured values of the time series sensing data are symbolized into a symbols, the critical value $y_i$ as the basis of symbol allocation can be calculated as mathematically expressed in Equation (3):

$$y_i = \Phi^{-1}\left(\frac{i}{\alpha}\right) \quad (3)$$

where i=1, 2, . . . , α−1 and $\Phi^{-1}(\bullet)$ denotes an inverse function of standard normal distribution.

FIG. 8A illustrates an example of symbolizing measured values of time series sensing data into 4 symbols A, B, C and D (α=4). As the result of the symbolizing, the time series sensing data shown in FIG. 8A may be converted into "ACDBBDCA".

As shown in FIG. 8B, the symbolizing may include converting letters, e.g., alphabetical letters, into digit numbers. FIG. 8B illustrates an example of symbolizing measured values of time series sensing data into 5 symbols 1, 2, 3, 4 and 5 (α=5). That is to say, when a normalized measured value is y1 or less, a section corresponding to the normalized measured value is symbolized into "1". When a normalized measured value is in a range of y1 to y2, a section corresponding to the normalized measured value is symbolized into "2". When a normalized measured value is in a range of y2 to y3, a section corresponding to the normalized measured value is symbolized into "3". When a normalized measured value is in a range of y3 to y4, a section corresponding to the normalized measured value is symbolized into "4". When a normalized measured value is y4 or greater, a section corresponding to the normalized measured value is symbolized into "5".

FIG. 8B illustrates that the time series sensing data generated at the time of producing a wafer 0310 is symbolized into "34245", the time series sensing data generated at the time of producing a wafer 0314 is symbolized into "24245", and the time series sensing data generated at the time of producing a wafer 0320 is symbolized into "43245".

The pre-processing process of the time series sensing data generated at the time of producing each product has been hitherto described. As shown in FIG. 5, the pre-processing process is performed through the divisional compression (S122), the normalization (S124) and the symbolization (S126) in sequence. However, according to an embodiment of the present invention, only the normalization (S124) and the symbolization (S126) may be sequentially performed without performing the divisional compression (S122).

Hereinafter, a verification result by the bad pattern verifying method shown in FIG. 1 will be described with reference to FIG. 9.

FIG. 9 illustrates that a bad pattern is symbolized into "65 67 68 65 65". As shown in FIG. 9, when a number of products (Glass IDs y1 to y5) satisfying conditions of suspicious equipment, suspicious sensor and verification period defined as verification parameters is 5 in total, the time series sensing data generated at the time of producing each product is pre-processed and a symbol array (SAXed sensor data) is then calculated.

According to an embodiment of the present invention, 3 kinds of similarity measures (a first similarity measure, a second similarity measure, and a third similarity measure) between the symbol array of the bad pattern and the symbol array of the time series sensing data can be calculated. The respective similarity measures are the same with one another in that all of the similarity measures have values in a range between 0 and 1, but are different from one another in that similarity measures between two symbol arrays are evaluated in terms of different parameters. In order to calculate the similarity measures, it is assumed that a predetermined digit number is matched to each symbol or each symbol is comprised of digit numbers.

The first similarity measure is a similarity measure of an Euclidean ratio between the symbol array of the bad pattern and the symbol array of the time series sensing data of the measured values. The first similarity measure can be calculated, as expressed in Equation (4):

$X=(x_1, x_2, \ldots, x_n)$ $Y^1=(y_1^1, y_2^1, \ldots, y_n^1)$ $Y^2=(y_1^2, y_2^2, \ldots, y_n^2)$ $Y^m=(y_1^m, y_2^m, \ldots, y_n^m)$ where X is a symbol array of the bad pattern, $Y^k$ is a symbol array of the time series sensing data of the measured values for a product k,
Euclidean ratio between X and $$Y^k == 1 - \frac{d^k}{\max_k (d^k)},$$

where $$d^k = \sqrt{\sum_{i=1}^{n} (x^i - y_i^k)^2}.$$

For example, when X=(1, 3, 5, 5, 1), $Y^1$=(4, 3, 6, 6, 0), and $Y^2$=(4, 2, 4, 4, 7), $d^1$=3.4641 and $d^2$=6.9282. Thus, the Euclidean ratio of X to $Y^1$ will be 0.5 and the Euclidean ratio of X to $Y^2$ will be 0.

The second similarity measure may be a similarity measure of a correlation (r) between the symbol array of the bad pattern and the symbol array of the time series sensing data. The correlation between two variables is widely known in the art and a detailed description thereof will not be given.

The third similarity measure may be a trend similarity between the symbol array of the bad pattern and the symbol array of the time series sensing data. The trend similarity is a similarity measure between symbol increasing/decreasing index arrays indicating whether a symbol value of the immediately previous section on a time axis increases and decreases.

The trend index similarity between the symbol array $X=(x_1, x_2, \ldots, x_n)$ of the bad pattern and the symbol array $Y=(y_1, y_2, \ldots, y_n)$ of the time series sensing data can be calculated, as expressed in Equation (5):

1. Calculate: $\Delta x_i = x_{i+1} - x_i$ $\Delta y_i = y_{i+1} - y_i$

2. Calculate $\Delta xy_i$ by obtaining signs of $(\Delta x_i, \Delta y_i) \rightarrow$
   If sign $(\Delta x_i)$=sign $(\Delta y_i)$, $\Delta xy_i$=1, Otherwise $\Delta xy_i$=0.
3.

$$\text{Trend index similarity} = \frac{\sum \Delta xy_i}{n-1}.$$

For example, when the symbol array of the bad pattern, X=(1, 3, 5, 5, 1), and the symbol array of the time series sensing data, $Y=(4, 3, 6, 6, 0)$, $\Delta X_i=(2, 2, 0, -4)$, $\Delta Y_i=(2, 2, 0, -4)$, $\Delta XY_i=(0, 1, 1, 1)$, so that the trend index similarity becomes 0.75.

According to the present embodiment of the present invention, when one of the first to third similarity measures of the measured time series sensing data for a particular product is 1, the measured time series sensing data is determined to be similar to the bad pattern and it is checked whether the particular product has been determined as a good/bad product. If the measured time series sensing data for the particular product has been determined to be similar to the bad pattern and the particular product has been determined as a good product, the more cases, the higher bad pattern error rate.

According to the present embodiment of the present invention, the bad pattern error rate may be defined as a proportion of products determined as good products among products having at least one of the first and third similarity measures. In such a case as shown in FIG. 9, for example, since the symbol array of measured time series sensing data for products y2 and y1 is determined as to be similar to the symbol array of the bad pattern and there is no product determined as a good product, the bad pattern error rate becomes 0.

Hereinafter, the configuration and operation of a bad pattern verification system according to another embodiment of the present invention will be described with reference to FIG. 10.

Figure 10:
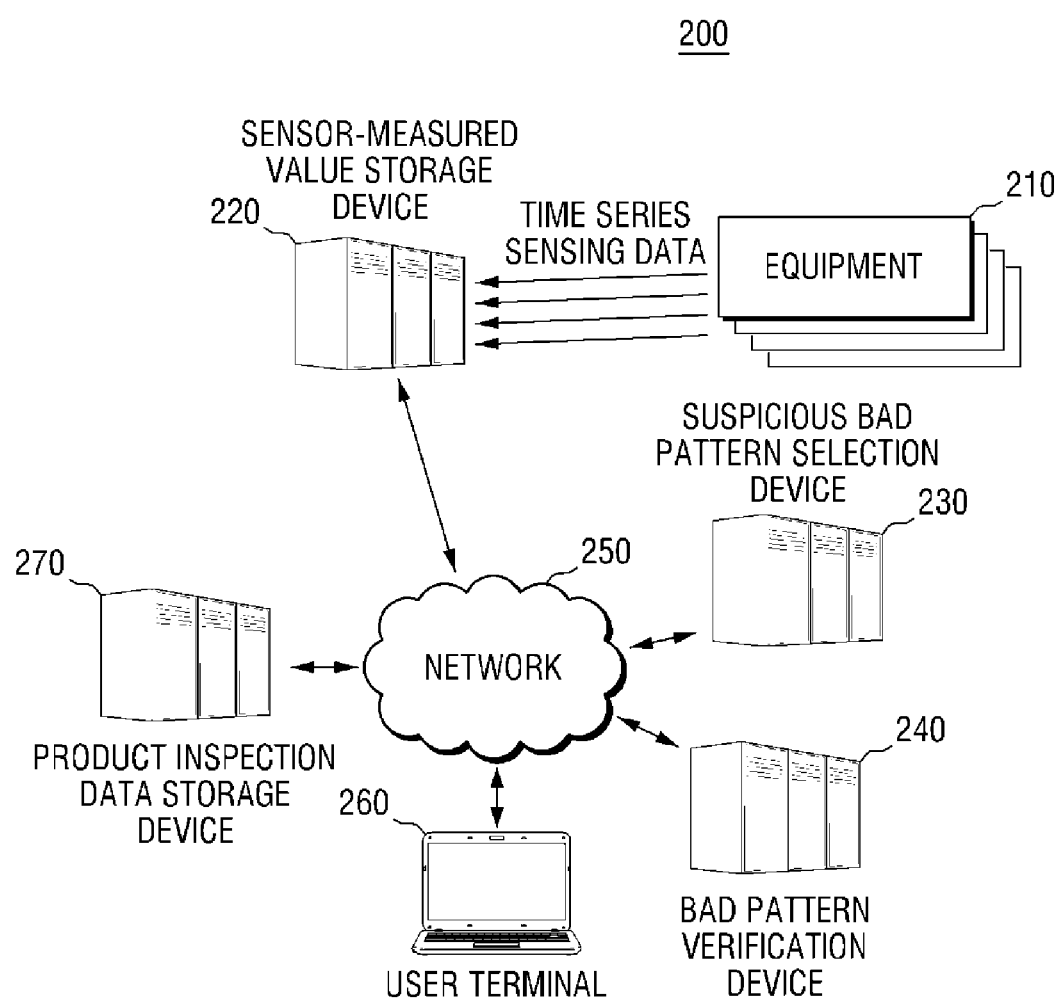
FIG. 10 is a schematic diagram of a bad pattern verification system according to another embodiment of the present invention.

As shown in FIG. 10, the bad pattern verification system 200 according to the present embodiment may include a suspicious bad pattern selection device 230 and a bad pattern verification device 240.

After measured values are generated by sensors provided in equipment 210 when the products pass through the equipment 210, the suspicious bad pattern selection device 230 selects suspicious equipment, a suspicious sensor and bad pattern expected to cause particular faults by analyzing time series sensing data stored in a sensor-measured value storage device 220 in linkage with product inspection data stored in a product inspection data storage device 270.

A user terminal 260 generates verification parameters for producing verification processes for the suspicious equipment, the suspicious sensor and the bad pattern, which are selected by the suspicious bad pattern selection device 230 according to manipulation by a manager, and provides the generated verification parameters to the bad pattern verification device 240.

The bad pattern verification device 240 receives information on bad pattern applied to time series sensing data of the suspicious sensor, accesses the time series sensing data of each product, generated by the suspicious sensor and stored in the sensor-measured value storage device 220 during a verification period, calculates similarity measures between the bad pattern based on the bad pattern information and the time series sensing data, for each product, and calculates a bad pattern error rate based on the similarity measures. The bad pattern verification device 240 may provide the calculated bad pattern error rate to the user terminal 260.

Figure 11:
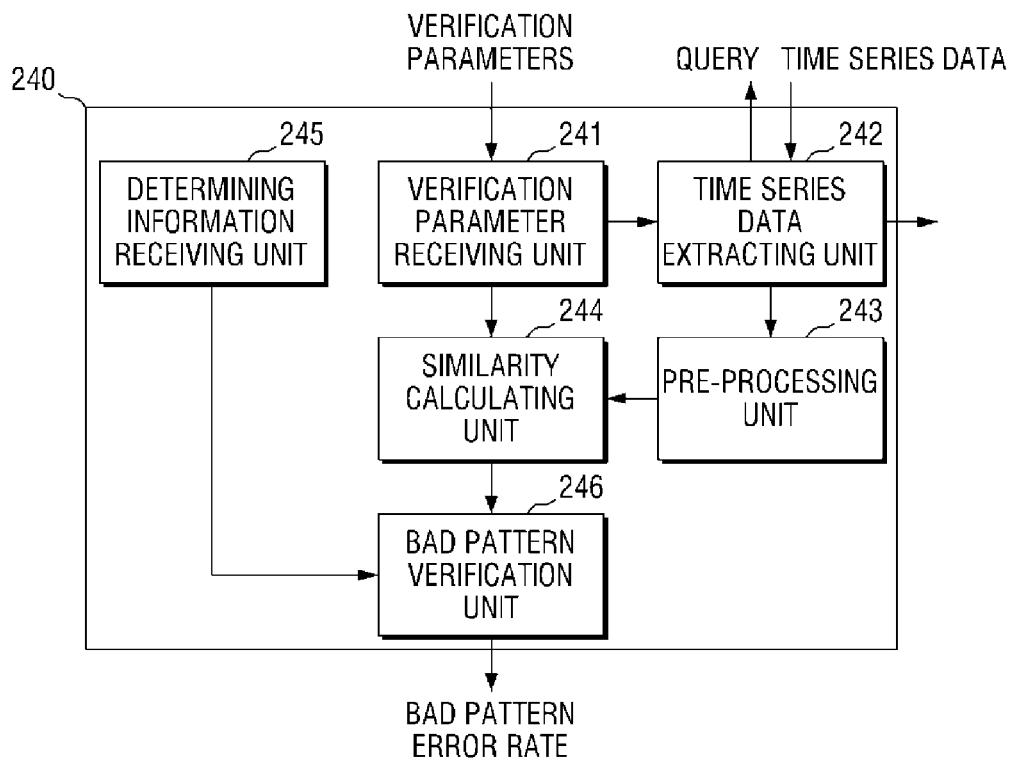
FIG. 11 is a block diagram of a bad pattern verification system according to still another embodiment of the present invention.

Hereinafter, the configuration and operation of a bad pattern verification system according to still another embodiment of the present invention will be described with reference to FIG. 11. As shown in FIG. 11, the bad pattern verification device 240 according to the present embodiment may include a verification parameter receiving unit 241, a time series sensing data extracting unit 242, a pre-processing unit 243, a similarity measure calculating unit 244, a determining information receiving unit 245 and a bad pattern verification unit 246.

The verification parameter receiving unit 241 receives the verification parameters including bad pattern information applied to the suspicious sensor measured time series sensing data and verification method information. The verification parameters may be received from the user terminal 260. The verification method information may include verification period information, a number (W) of sections used in divisional compression, and a number ($\alpha$) of symbols used in symbolization.

The time series sensing data extracting unit 242 accesses the time series sensing data of each product, generated by the suspicious sensor during the verification period based on the verification method information.

The pre-processing unit 243 may perform a pre-processing process on the time series sensing data of each product, extracted by the time series sensing data extracting unit 242. The pre-processing unit 243 may perform the pre-processing process having been described above with reference to FIGS. 5 to 8B. For example, the pre-processing unit 243 may sequentially perform the divisional compression (S122), the normalization (S124) using a mean and a variance, and the SAX based symbolization (S126).

The similarity measure calculating unit 244 calculates a first similarity measure, a second similarity measure and a third similarity measure between the symbol array of the bad pattern and the symbol array of the time series sensing data, for each product. Here, each of the first to third similarity measures has a value in a range between 0, which means non-similarity, and 1, which means the sameness.

The first similarity measure is an Euclidean ratio between the bad pattern based on the bad pattern information and the symbol array of the time series sensing data, the second similarity measure is a correlation between the symbol array of the bad pattern and the symbol array of the time series sensing data, and the third similarity measure is a trend similarity between the symbol array of the bad pattern and the symbol array of the time series sensing data. The trend similarity is a similarity measure between symbol increasing/decreasing index arrays indicating whether a symbol value of the immediately previous section on a time axis increases or decreases.

The bad pattern verification unit 246 calculates the bad pattern error rate based on the similarity measures calculated by the similarity measure calculating unit 244. The bad pattern verification unit 246 receives fault determining information from the determining information receiving unit 245 querying the fault determining information of each product, calculates a number of products determined as good products among products having a value 1 as a value of at least one of the first and second similarity measures, and calculates the error rate using the number of the products determined as good products.

Figure 12:
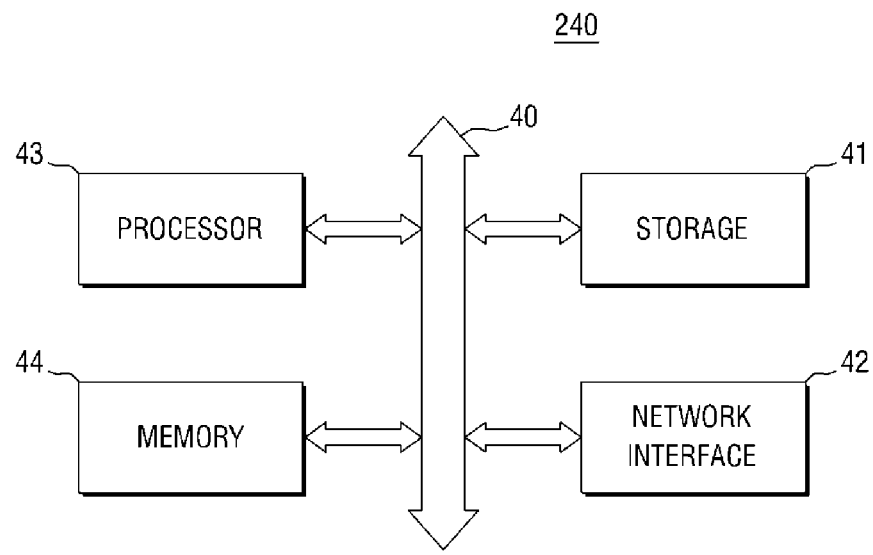
FIG. 12 is another schematic diagram of the bad pattern verification system shown in FIG. 11.

FIG. 12 is another schematic diagram of the bad pattern verification system different from the bad pattern verification system shown in FIG. 11. A bad pattern verification device 240 may have the same configuration as shown in FIG. 12. The bad pattern verification device 240 may include a processor 43 for executing commands, a storage 41 in which bad pattern verification program data is stored, a memory 44, a network interface 42 transmitting/receiving data with respect to an external device, and a data bus 40 connected to the storage 41, the network interface 42, the processor 43 and the memory 44 to serve as a data movement path.

Bad pattern verification program data may be stored in the storage 41. The bad pattern verification program may include a module receiving information on bad pattern applied to time series sensing data measured by a suspicious sensor, a module accessing the time series sensing data of each product, generated by the suspicious sensor during a verification period, a module calculating the similarity measures between the bad pattern based on the bad pattern information and the time series sensing data, for each product, and a module calculating the bad pattern error rate based on the similarity measures.

Figure 13A:
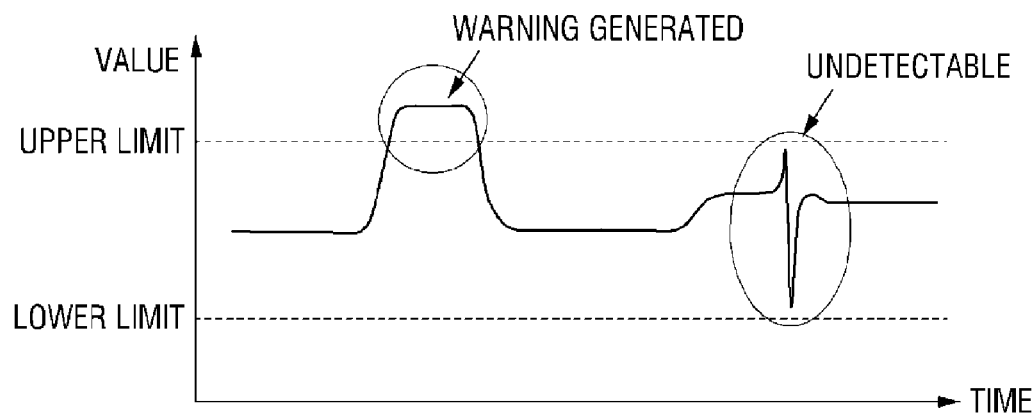
FIGS. 13A and 13B illustrate results of monitoring sensing data in production equipment according to still another embodiment of the present invention and in conventional production equipment.
Figure 13B:
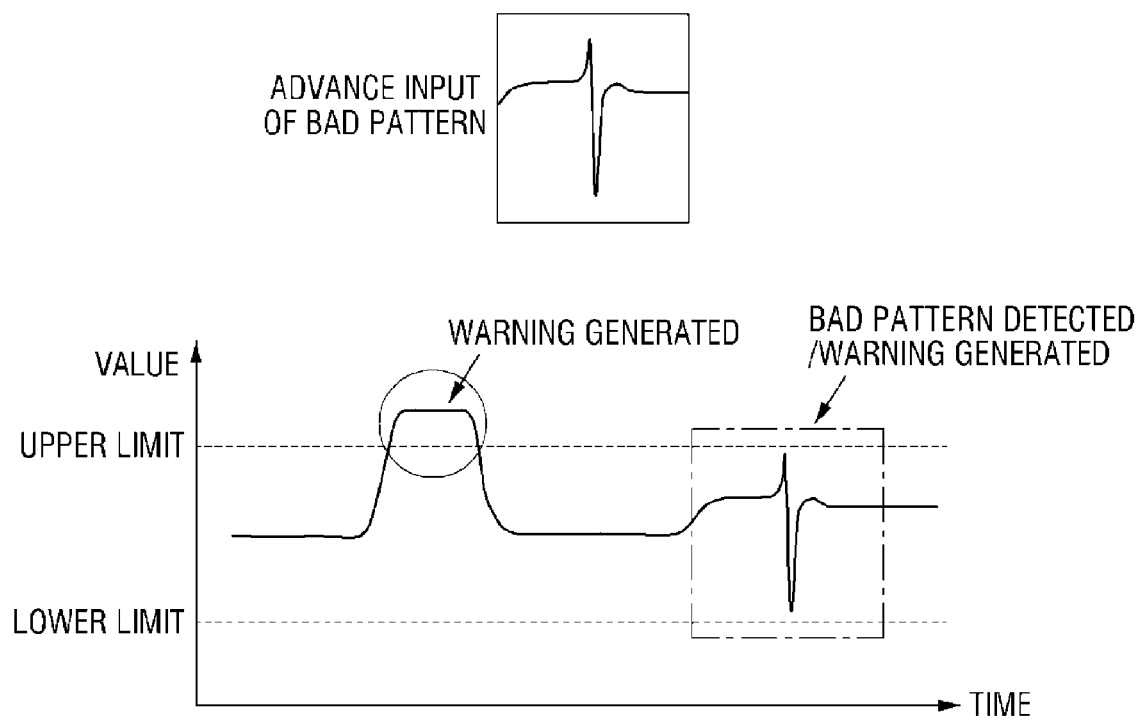

FIGS. 13A and 13B illustrate results of monitoring sensing data in production equipment according to still another embodiment of the present invention and in conventional production equipment. In a monitoring process by the conventional production equipment, an upper limit and a lower limit are just specified and managed for a value measured by a sensor provided in production equipment. However, even if a bad pattern is generated, generation of the bad pattern may be undetectable when the bad pattern is positioned between the upper limit and the lower limit, and generation of a fault due to the generation of the bad pattern may not be avoided. A problem arising in the conventional equipment is illustrated in FIG. 13A.

Meanwhile, in the monitoring process in the production equipment according to still another embodiment of the present invention, a bad pattern of the sensing data that is input in advance can be detected, and a warning signal may be generated when the bad pattern is detected. An effect exhibited in the present embodiment is shown in FIG. 13B.

Figure 14:
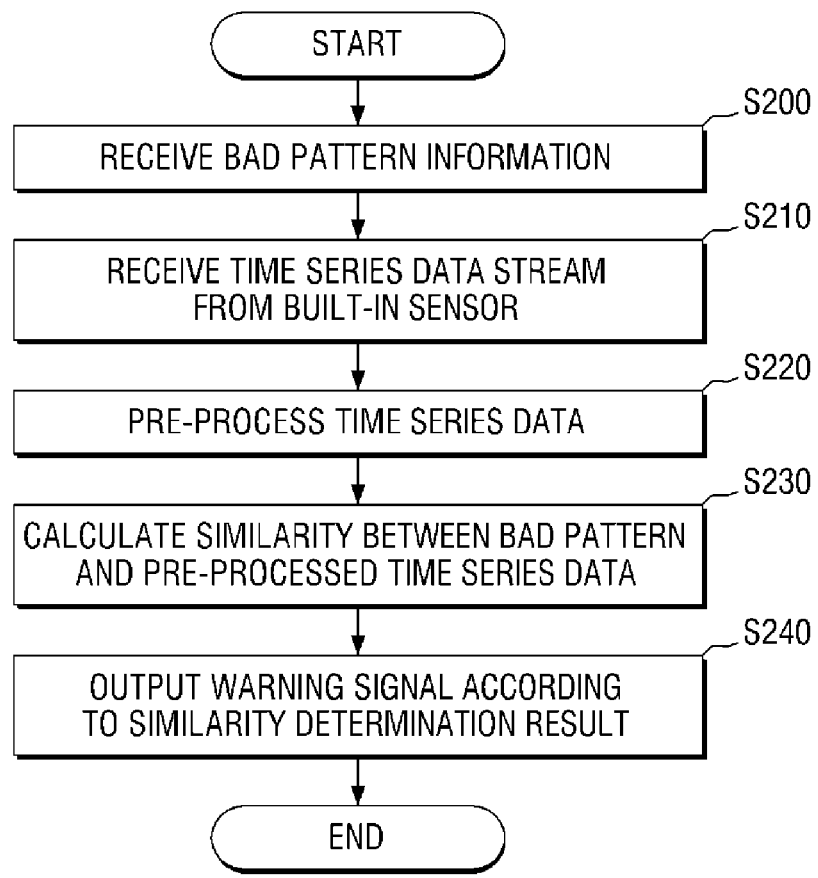
FIG. 14 is a flowchart of a monitoring process of sensing data generated from a sensor of production equipment according to still another embodiment of the present invention.

FIG. 14 is a flowchart of a monitoring process of sensing data generated from a sensor of production equipment according to still another embodiment of the present invention. The monitoring process of the sensing data illustrated in FIG. 14 may be performed by the production equipment.

First, bad pattern information applied to time series sensing data measured by a sensor targeted for monitoring is received (S200). Here, in addition to the bad pattern information, information on a pre-processing process of the time series sensing data, for example, a number (W) of sections used in divisional compression, and a number ($\alpha$) of symbols used in symbolization, may further be received.

Next, the time series sensing data is received from the monitoring target sensor produced according to the operation of the production equipment (S210).

Next, a pre-processing process is performed on the time series sensing data (S220). In the pre-processing process, the same pre-processing process as described above with reference to FIGS. 5 to 8B may be used.

Next, a similarity measure of an Euclidean ratio, a similarity measure of a correlation, and a trend similarity between the bad pattern based on the bad pattern information and the symbol array of the time series sensing data are calculated (S230). Here, each of the Euclidean ratio, the correlation and the trend similarity has a value in a range between 0, which means non-similarity, and 1, which means the sameness.

Next, when the bad pattern based on the bad pattern information and the time series sensing data pattern are determined to be similar to each other, a warning signal is output (S240). According to an embodiment of the present invention, when the bad pattern based on the bad pattern information and the time series sensing data pattern are determined to be similar to each other, further to the outputting of the warning signal, the production process may be automatically interrupted.

According to an embodiment of the present invention, when the calculated value of at least one of the Euclidean ratio, the correlation and the trend similarity is 1, the bad pattern based on the bad pattern information and the time series data pattern may be determined to be similar to each other.

The trend similarity is a similarity measure of a pattern increasing/decreasing according to the passage of time. As to a method of calculating the trend similarity measure, the Equation (5) can be referred to.

Figure 15:
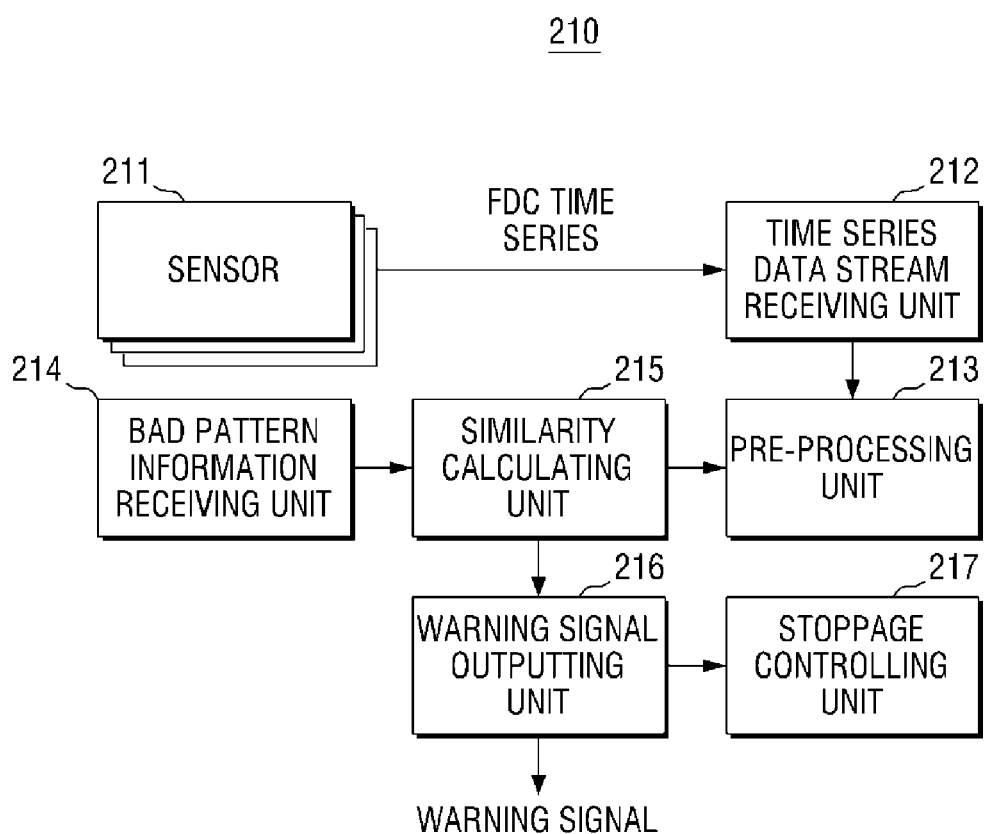
FIG. 15 is a block diagram of production equipment according to still another embodiment of the present invention.

FIG. 15 is a block diagram of production equipment according to still another embodiment of the present invention.

As shown in FIG. 15, the production equipment 210 according to an embodiment of the present invention includes one or more sensors 211 and modules calculating similarity measures with respect to bad pattern by analyzing FDC time series sensing data supplied from the sensors 211 and outputting a warning signal based on the calculated similarity measures.

First, the time series sensing data stream receiving unit 212 receives a time series sensing data stream measured from the one or more sensors 211. The time series sensing data stream receiving unit 212 transfers the time series sensing data stream to the pre-processing unit 213. The pre-processing unit 213 performs a pre-processing process on the time series sensing data stream. The pre-processing unit 213 may perform the same pre-processing process described above with reference to FIGS. 5 to 8B. For example, the pre-processing unit 213 may sequentially perform processes of divisional compression (S122), normalization (S124) and SAX based symbolization (S126).

The bad pattern information receiving unit 214 receives detection parameters including information on bad pattern and information on a detection method. The detection parameters may be received from the user terminal 260. The detection method information may include verification period information, a number (W) of sections used in divisional compression, and a number ($\alpha$) of symbols used in symbolization. The time series sensing data based on the bad pattern information may have a pattern including measured values in a range between an upper limit and a lower limit of a predefined measured value. That is to say, the production equipment according to the present embodiment may detect bad pattern comprised of measured values not exceeding the range between the upper limit and the lower limit of the predefined measured value.

The similarity measure calculating unit 244 calculates a first similarity measure, a second similarity measure and a third similarity measure between the symbol array of the bad pattern and the symbol array of the measured time series sensing data, for each product. Here, each of the first to third similarity measures has a value in a range between 0, which means non-similarity, and 1, which means the sameness.

When at least one of the Euclidean ratio, the correlation and the trend similarity, calculated by the similarity measure calculating unit 215, has a value of 1, the warning signal output unit 216 generates a warning signal.

The production equipment according to the present embodiment may further include a stoppage controlling unit 217 receiving the warning signal from the warning signal output unit 216 and generating a control signal for controlling a production operation to be stopped.

Figure 16:
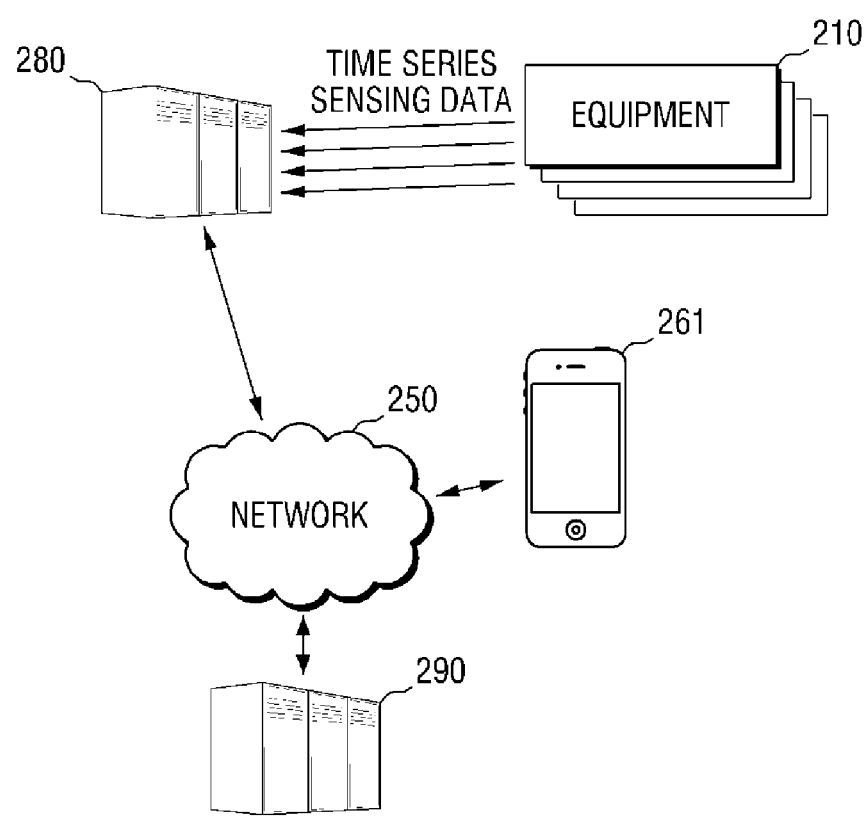
FIG. 16 is a schematic diagram of a reference pattern detection system according to still another embodiment of the present invention.

FIG. 16 is a schematic diagram of a reference pattern detection system according to still another embodiment of the present invention.

The reference pattern detection system according to the present embodiment may receive time series sensing data from the one or more sensors and may detect generation of a reference pattern. Unlike the "bad pattern", the "reference pattern" is used to indicate a temporary or usual fault generated in the production equipment or a fault generated under a particular condition, but not limited thereto. Rather, the "reference pattern" may be broadly used to indicate time series sensing data patterns to be detected from the time series sensing data received from the sensors. Therefore, the "reference pattern" includes "bad pattern".

As shown in FIG. 16, the reference pattern detection system according to the present embodiment may include a reference pattern detecting apparatus 280 receiving time series sensing data from one or more production equipment 210, detecting generation of bad pattern and, when the generation of bad pattern is detected, and outputting a warning signal.

The reference pattern detecting apparatus 280 may receive the bad pattern information and information on the equipment 210 and sensors, to which bad pattern are to be applied, from the reference pattern providing apparatus 290 connected through the network 250.

The warning signal generated by the bad pattern detecting apparatus 280 may be transmitted to a mobile terminal 261 of a production manager, for example, on a real time basis.

Figure 17:
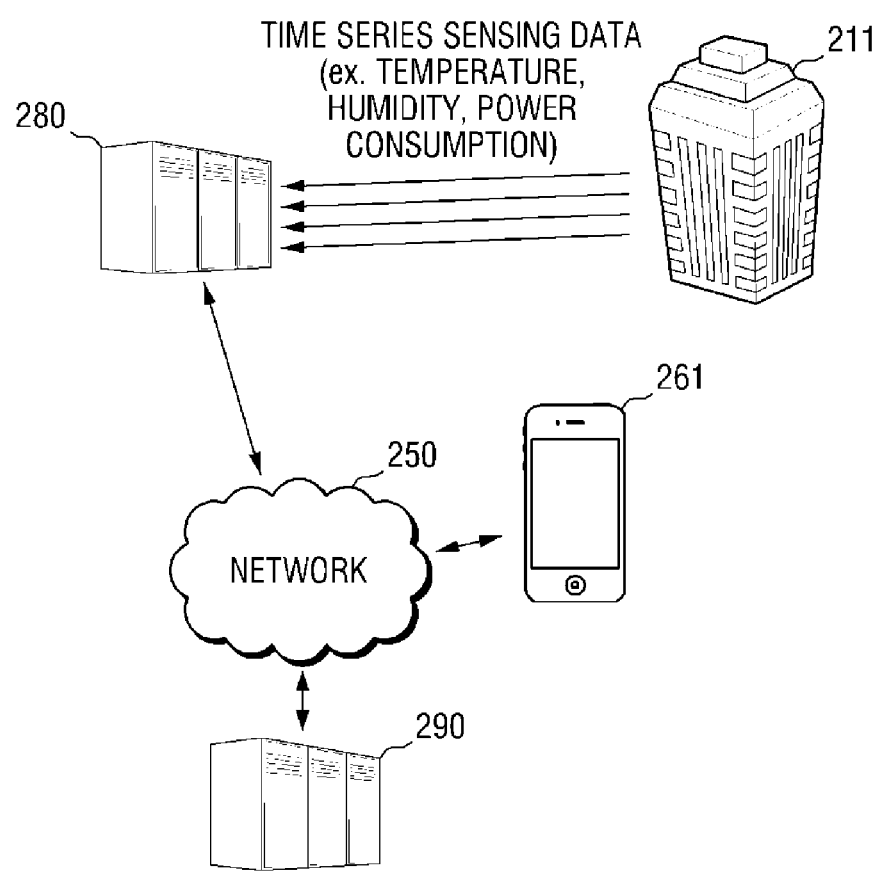
FIG. 17 is a schematic diagram of a reference pattern detection system according to still another embodiment of the present invention.

FIG. 17 is a schematic diagram of a reference pattern detection system according to still another embodiment of the present invention.

As shown in FIG. 17, the reference pattern detection system according to the present embodiment may include a reference pattern detecting apparatus 280 receiving time series sensing data from at least one of an environment sensor and an energy consumption sensor, which are installed in a building 211, detecting generation of a reference pattern, and outputting a warning signal when the generation of the reference pattern is detected. The reference pattern detection system according to the present embodiment may be connected to a building energy management system (BEMS) or may be used as a component of the BEMS.

The reference pattern detecting apparatus 280 may receive reference pattern information for the environment sensor and reference pattern information for the energy consumption sensor, suggesting that a predetermined abnormal situation has occurred, from the reference pattern providing apparatus 290 connected through the network 250.

According to an embodiment of the present invention, the predetermined "abnormal situation" may occur when a reference pattern for the environment sensor and a reference pattern for the energy consumption sensor are both detected. The reference pattern detecting apparatus 280 may detect generation of the reference pattern for the environment sensor by monitoring sensing data supplied from the environment sensor and may detect generation of the reference pattern for the energy consumption sensor by monitoring sensing data supplied from the energy consumption sensor, thereby determining occurrence of the "abnormal situation".

Figure 18:
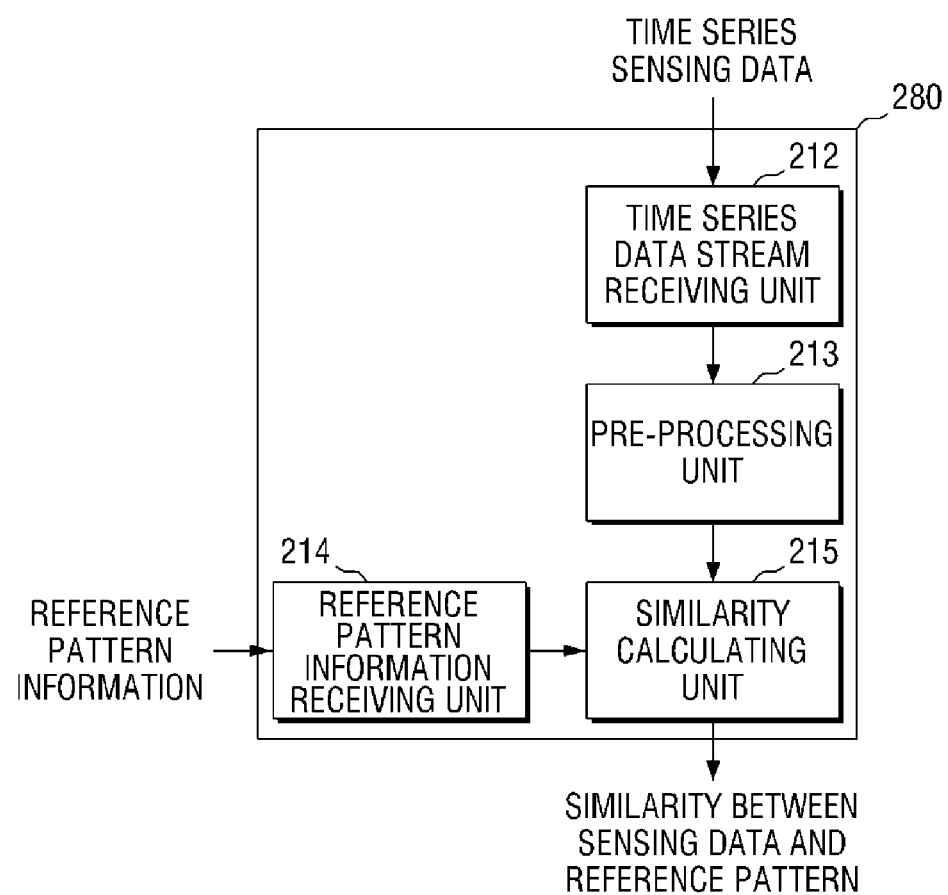
FIG. 18 is a first block diagram of a reference pattern detection system according to still another embodiment of the present invention.

FIG. 18 is a first block diagram of a reference pattern detection system according to still another embodiment of the present invention.

As shown in FIG. 18, the reference pattern detecting apparatus 280 according to the embodiment of the present invention may include a time series sensing data stream receiving unit 212, a pre-processing unit 213, a similarity measure calculating unit 215, and a reference pattern information receiving unit 214.

First, the time series sensing data stream receiving unit 212 receives a time series sensing data stream measured from one or more sensors connected through the network. The time series sensing data stream receiving unit 212 transfers the measured time series sensing data stream to the pre-processing unit 213. The pre-processing unit 213 performs a pre-processing process on the time series sensing data stream. The pre-processing unit 213 may perform the same pre-processing process described above with reference to FIGS. 5 to 8B. For example, the pre-processing unit 213 may sequentially perform processes of divisional compression (S122), normalization using a variance and a mean value (S124) and SAX based symbolization (S126).

The reference pattern information receiving unit 214 receives detection parameters including information on bad pattern and information on a detection method. The detection parameters may be received from the user terminal 260. The detection method information may include verification period information, a number (W) of sections used in divisional compression, and a number ($\alpha$) of symbols used in symbolization.

The reference pattern information may include the "bad pattern". The bad pattern may be patterns including measured values in a range between an upper limit and a lower limit of a predefined measured value. That is to say, the reference pattern detecting apparatus 280 according to the present embodiment may detect bad pattern comprised of measured values not exceeding the range between the upper limit and the lower limit of the predefined measured value.

The similarity measure calculating unit 244 calculates and outputs a first similarity measure, a second similarity measure and a third similarity measure between the symbol array of the reference pattern and the symbol array of the measured time series sensing data, for each product. Here, each of the first to third similarity measures has a value in a range between 0, which means non-similarity, and 1, which means the sameness.

The reference pattern detecting apparatus 280 according to the present embodiment may be connected to a building energy management system (BEMS) or may be used as a component of the BEMS. Here, the one or more sensors may include a first sensor that measures energy consumption of a building. Here, the reference pattern may be a pattern applied to the first sensor to indicate occurrence of a particular situation.

FIG. 19 is a second block diagram schematic diagram of a reference pattern detection system according to still another embodiment of the present invention.

As shown in FIG. 19, the reference pattern detecting apparatus according to still another embodiment of the present invention may further include a warning signal output unit 216.

When at least one of the Euclidean ratio, the correlation and the trend similarity, calculated by the similarity measure calculating unit 215, has a value of 1, the warning signal output unit 216 generates a warning signal.

The warning signal may be supplied to production equipment from which the bad pattern are sensed through a network.

According to an embodiment of the present invention, in a predetermined "abnormal situation" occurring when a reference pattern for an environment sensor and a reference pattern for an energy consumption sensor are both detected, the reference pattern detecting apparatus may generate and output the warning signal. Here, the one or more sensors include a first sensor that measures energy consumption of a building and a second sensor that measures an internal environment parameter of the building. The reference pattern information receiving unit 214 receives first reference pattern information applied to the first sensor and second reference pattern information applied to the second sensor. The similarity measure calculating unit 215 calculates and outputs a similarity measure of an Euclidean ratio, a similarity measure of a correlation and a trend similarity measure between the first reference pattern based on the first reference pattern information and sensing data of the first sensor, and calculates and outputs a similarity measure of an Euclidean ratio, a similarity measure of a correlation and a trend similarity measure between the second reference pattern based on the second reference pattern information and sensing data of the second sensor.

When the calculated value of at least one of the Euclidean ratio, the correlation and the trend similarity of the first sensor is 1 and when the calculated value of at least one of the Euclidean ratio, the correlation and the trend similarity of the second sensor is 1, the warning signal output unit 216 generates and outputs the warning signal.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

This invention, explained by referring FIGS. 1-15, may be implemented by using a computer readable code on a non-transitory machine-readable medium. For example, a computer program product comprising a non-transitory machine-readable medium storing instructions that, when executed by at least one programmable processor, cause the at least one programmable processor to perform operations comprising may be provided for the implementation of this invention.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method for verifying a bad pattern in sensing data, the method comprising:
receiving bad pattern information applied to sensing data measured by a sensor;
accessing the sensing data of each product, generated by the sensor;
calculating similarity measures between the bad pattern based on the bad pattern information and the accessed sensing data; and
calculating an error rate of the bad pattern based on the similarity measures,
wherein the calculating of the error rate of the bad pattern comprises:
querying information of each product; and
calculating the error rate of the bad pattern by comparing the information with at least one of the calculated similarity measures,
wherein the calculating the similarity measures between the bad pattern based on the bad pattern information and the accessed sensing data comprises calculating a first similarity measure between the bad pattern based on the bad pattern information and the sensing data according to a first standard and a second similarity measure between the bad pattern based on the bad pattern information and the sensing data according to a second standard,
wherein each of the first and second similarity measures have a value in a range between 0, which means non-similarity, and 1, which means sameness, and
wherein the calculating of the bad pattern error rate comprises:
when one or more of the first and second similarity measures of a particular product have a value 1 and the particular product is determined as a good product based on the information, selecting the particular product as an error case of the bad pattern information: and
calculating the error rate based on a number of error cases.

2. The method claim 1, wherein the accessing to the sensing data of each product comprises accessing sensing data of each product as fault detection & classification (FDC) data generated by the sensor for a predetermined period.

3. The method of claim 1, wherein the sensing data is time series sensing data.

4. The method of claim 1, wherein the accessing of the sensing data of each product, generated by the sensor occurs during a verification period.

5. A method for verifying a bad pattern in sensing data, the method comprising:
receiving bad pattern information applied to sensing data measured by a sensor;
accessing the sensing data of each product, generated by the sensor;
calculating similarity measures between the bad pattern based on the bad pattern information and the accessed sensing data; and
calculating an error rate of the bad pattern based on the similarity measures,
wherein the calculating of the similarity measures comprises:
obtaining a first array of the accessed sensing data; and
calculating the similarity measures between a second array of the bad pattern information and the obtained first array,
wherein the obtaining further comprises:
dividing a time axis of the accessed sensing data into a predetermined number of sections, calculating representative values of measured values for each divided section, and storing the calculated representative values of the measured values;
normalizing the stored representative values using a mean and a variance of the stored representative values; and
converting the accessed sensing data into the first array by providing symbols allocated to each of the normalized representative values for each section.

6. The method of claim 5, wherein the calculating the similarity measures between a second array of the bad pattern information and the obtained first array comprises:

calculating a first symbol increasing/decreasing index array indicating whether a symbol value increases/decreases from an immediately previous section on a time-axis, for the first array of the accessed time series sensing data; and calculating a similarity measure between a second symbol increasing/decreasing index array of the bad pattern information and the calculated first symbol increasing/decreasing index array.

7. The method of claim 6, wherein the calculating the similarity measures between the second array of the bad pattern information and the obtained first array further comprises:

calculating a similarity measure of an Euclidean ratio between the second array of the bad pattern information and the obtained first array; and calculating a similarity measure of a correlation between the second array of the bad pattern information and the obtained first array.

8. An apparatus for verifying a bad pattern in sensing data, the apparatus comprising:

a verification parameter receiving unit configured to receive verification parameters including information on the bad pattern applied to sensing data of a sensor and information on a verification method;

a sensing data extracting unit configured to access the sensing data of each product, generated by the sensor based on verification method information;

a similarity measure calculating unit configured to calculate similarity measures between the bad pattern based on the bad pattern information and the sensing data, for each product;

a bad pattern verification unit configured to calculate an error rate of the bad pattern based on the similarity measures; and a pre-processing unit configured to receive the sensing data of each product from the sensing data extracting unit, apply a pre-processing process to the sensing data of each product and supply the pre-processed data to the similarity measure calculator, wherein the pre-processing unit comprises:

a sensor data division & compression module configured to divide a time axis of the sensing data of each product into a predetermined number of sections, calculate representative values of sensing data for each divided section, and store the calculated representative values; a normalization module configured to normalize the stored representative values using a mean and a variance of the stored representative values; and a SAX conversion module SAX (Symbolic Aggregate approXimation) configured to convert the sensing data of each product into a first array by providing symbols allocated to each of the normalized representative values for each section and supplying the SAX converted data to the similarity measure calculator.

9. The apparatus of claim 8, wherein the pre-processing unit converts the sensing data based on the bad pattern information into the first array, and the similarity measure calculator calculates a first similarity measure, a second similarity measure and a third similarity measure between the first array of the bad pattern and a second array of the sensing data, for each product, wherein each of the first to third similarity measures has a value in a range between 0, which means non-similarity, and 1, which means sameness, the first similarity measure being an Euclidean ratio between the bad pattern based on the bad pattern information and the second array of the sensing data, the second similarity measure being a correlation between the first array of the bad pattern and the second array of the sensing data, and the third similarity measure being a trend similarity between the first array of the bad pattern and the second array of the sensing data, and wherein the trend similarity is a similarity measure between a first symbol increasing/decreasing index array, each item in the first symbol increasing/decreasing index array indicating whether each symbol value in the first symbol increasing/decreasing index array increases or decreases from the immediately previous section on a time-axis.

10. The apparatus of claim 9, wherein a determining information receiving unit queries information of each product, wherein the similarity measure calculator receives the information from the determining information receiving unit, calculates a number of products determined as good products among products having 1 as a value of at least one from among the first to the third similarity measures and calculates the error rate using the number of products determined as good products.

11. The apparatus of claim 8, wherein the sensing data is time series sensing data.

12. The apparatus of claim 8, wherein the accessing of the sensing data of each product, generated by the sensor occurs during a verification period.

* * * * *